(12) United States Patent
Nozuyama et al.

(10) Patent No.: US 7,096,140 B2
(45) Date of Patent: Aug. 22, 2006

(54) TEST SYSTEM, TEST METHOD AND TEST PROGRAM FOR AN INTEGRATED CIRCUIT BY IDDQ TESTING

(75) Inventors: Yasuyuki Nozuyama, Tokyo (JP); Mahito Shidou, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/976,064

(22) Filed: Oct. 27, 2004

(65) Prior Publication Data
US 2005/0114065 A1  May 26, 2005

(30) Foreign Application Priority Data
Oct. 30, 2003 (JP) ............................. 2003-371046

(51) Int. Cl.
*G06F 19/00* (2006.01)
(52) U.S. Cl. ........................................ 702/117; 438/16
(58) Field of Classification Search ................ 702/117, 702/182–185, 188; 438/16
See application file for complete search history.

(56) References Cited

U.S. PATENT DOCUMENTS

| 5,592,494 | A | | 1/1997 | Nozuyama | 714/733 |
| 5,944,847 | A | * | 8/1999 | Sanada | 714/741 |
| 6,101,623 | A | | 8/2000 | Nozuyama | 714/733 |
| 2004/0004493 | A1 | * | 1/2004 | Furukawa | 324/765 |

FOREIGN PATENT DOCUMENTS

| JP | 06-061314 | 3/1994 |
| JP | 08-031109 | 2/1996 |
| JP | 08-335271 | 12/1996 |
| JP | 10-056735 | 2/1998 |
| JP | 11-271434 | 10/1999 |
| JP | 2000-206174 | 7/2000 |
| JP | 2001-021609 | 1/2001 |
| JP | 2002-258234 | 9/2002 |
| JP | 2003-045929 | 2/2003 |
| JP | P2003-107138 | 4/2003 |
| JP | 2003-222669 | 8/2003 |
| JP | P2001-91566 | 4/2004 |

OTHER PUBLICATIONS

Y. Okuda, "Decouple: Defect Current Detection In Deep Submicron IDDQ," Proc. International Test Conference, pp. 199-206, 2000.
B. Kruseman, et al., "The Future of Delta IDDQ Testing," Proc. International Test Conference, pp. 101-110, 2001.
A.C. Miller, "IDDQ Testing In Deep Submicron Integrated Circuits," Proc. International Test Conference, pp. 724-729, 1999.

(Continued)

*Primary Examiner*—Edward Raymond
(74) *Attorney, Agent, or Firm*—DLA Piper Rudnick Gray Cary US LLP

(57) ABSTRACT

A test system for an integrated circuit includes a grouping module grouping measurement points on basis of values of the quiescent supply current and setting measurement point groups; an average value setting module setting a weighted average value minimizes the sum of dispersion of the quiescent supply current; a calculating module calculating a maximum estimated value of dispersion of the quiescent supply current on the basis of the weighted average value; and a judgment module judging whether the integrated circuit passes or fails the judgment specification.

16 Claims, 8 Drawing Sheets

OTHER PUBLICATIONS

P. Maxwell et al. "Current Ratios: A Self-Scaling Technique for Production IDDQ Testing," Proc. International Test Conference, pp. 738-747, 1999.

Y. Nozuyama and M. Shido, "Development of a mA-Order IDDQ Test Method and Application to Real Device," SEMI Technology Symposium, pp. 18-5-23, Dec. 2003.

Y. Nozuyama et al., "Development of a mA-Order IDDQ Test Method and Application to Real Device," Technical Report of IEICE, vol. 103 No. 647, ICD2003-209 (Feb. 2004).

Official Action as received from the Japanese Patent Office, issued on Mar. 28, 2006 regarding the counterpart Japanese Patent Application No. 2003-371046.

* cited by examiner

TEST SYSTEM, TEST METHOD AND TEST PROGRAM FOR AN INTEGRATED CIRCUIT BY IDDQ TESTING

CROSS REFERENCE TO RELATED APPLICATIONS

This application is based upon and claims the benefit of priority from prior Japanese Patent Application P2003-371046 filed on Oct. 30, 2003; the entire contents of which are incorporated by reference herein.

BACKGROUND OF THE INVENTION

1. Field of the Invention

The present invention relates to a system, a method and a program for testing an integrated circuit, particularly for a complementary metal oxide semiconductor (CMOS) circuit.

2. Description of the Related Art

A CMOS circuit designed in such a way that no directs current path exists when there is no defect. Therefore, after an input is determined, only a minute amount of off-leakage current flows at a steady state. Therefore, a CMOS integrated circuit with a defective or faulty part causing an abnormal leakage current can be easily distinguished from a defect-free or fault-free one and rejected by measuring the power supply current values. Utilizing the phenomenon described above, a quiescent supply current (IDDQ) testing is a method of judging whether or not there is a defect or fault in the circuit, by measuring a quiescent supply current IDDQ which is a current in a quiescent state of an integrated circuit.

However, the miniaturization as a result of progress of fabrication process of integrated circuits, the IDDQ values have become in the range of 100 µA to tens of milli amperes or more in integrated circuits fabricated with a design rule of not more than approximately 0.25 µm. Therefore, in a pass/fail or not-faulty/faulty judging method for integrated circuits using a fixed specification value of quiescent supply current IDDQ, its value has to be in the range of several milli amperes to tens of milli amperes. For this reason, only the defects (faults) which generate abnormal currents of not less than several milli amperes can be detected, and hence the defect (fault) detection ability using the quiescent supply current testing has decreased greatly.

Therefore, there is a strong need for a quiescent supply current (IDDQ) test method in which attention is paid to measured values, average, deviation and outliers of the quiescent supply current IDDQ at a plurality of measurement points of an integrated circuit. There has been proposed a method of judging whether an integrated circuit is fault-free or not, by using ratio of each value to an average value of the values of the quiescent supply current IDDQ at a plurality of measurement points which are measured beforehand for fault-free reference samples of the integrated circuit, the measured values and an average value of the quiescent supply current IDDQ at a plurality of measurement points of the integrated circuit.

In general, the quiescent supply current IDDQ is obtained by adequately functionally operating the integrated circuit, by stopping the clock at an appropriate cycle (a measurement point), and by measuring after a lapse of an appropriate waiting time. In order to shorten the testing time, it is necessary to reduce the number of the measurement points to be as small as possible. It is a general practice to find out the measurement points by utilizing a dedicated measurement point selection tool, which receives connection information of the integrated circuit and sometimes adjacent wiring information extracted from connection information and layout information of the integrated circuit, and test patterns for the integrated circuit.

In the method disclosed in Japanese Patent Laid Open Publication No. 2001-91566, in a case where a measured value of quiescent supply current IDDQ of a fault-free reference (usually, an average value of measured values of quiescent supply current IDDQ of a plurality of references) is plotted as abscissa, and a measured value of quiescent supply current IDDQ of a fault-free integrated circuit is plotted as ordinate, it is supposed that all measurement points will be plotted on or near a straight line passing an origin. As shown in FIG. 11, criterion lines for judging fault-free products are set on both sides of a solid line, and along the solid line. When all the measurement points of the integrated circuit are included in a fault-free region sandwiched between the two criterion lines indicated by short dashed lines in FIG. 11, the integrated circuit is judged to be a fault-free or defect-free product. The marks "•" in FIG. 11 are IDDQ values of the fault-free product. A "reference" here refers to an integrated circuit that is manufactured by a process in which the process center condition is targeted.

Generally, in the mass production of integrated circuits however, process conditions often deviate from the targeted process center condition, and in particular, in fine processes of less than 0.25 µm, which are generally called deep sub-micron (DSM) processes, it becomes difficult to control the various process parameters and hence the deviation of process conditions tends to be great as the miniaturization advances. Thus, even in a relatively well-controlled production factory, the process often deviates from the center condition to some degree. As a result, when an integrated circuit is produced by accident under process conditions which deviate from the center condition, even in a fault-free integrated circuit, as shown in FIG. 11, for example, measurement points are roughly divided into two groups G1 and G2 as indicated by the symbol "+" and are plotted while falling outside of the preconditions of Japanese Patent Laid Open Publication No. 2001-91566. In this case, even if the straight line can be fitted to the measured values of the quiescent supply current IDDQ in one of the two groups, the measured values of quiescent supply current IDDQ in the other group always deviates from the straight line. For this reason, the product will be dealt with as a faulty (defective) product even if it is a fault-free (defect-free) one. This situation is apt to occur especially in a case where a few threshold voltages Vth,n and Vth,p of an NMOS and a PMOS are used for each circuit block of an integrated circuit for the purpose of increasing operational speed or the like.

In general, the number of integrated circuits manufactured under specific process conditions is large. Accordingly, many fault-free products are treated as faulty products, and integrated circuit manufacturers suffer a great loss. However, on the contrary, if the range of judging fault-free products is widened in fear of such a loss, it follows that faulty products are misjudged to be fault-free products and are shipped erroneously, and this might result in the loss of customer trust. Thus, in the test method of the quiescent supply current IDDQ disclosed in Japanese Patent Laid Open Publication No. 2001-91566, it has been difficult to make a high-reliability judgment on whether an integrated circuit is a fault-free (defect-free) or a faulty (defective) product, by appropriately adapting to dispersion in process conditions which are usually supposed in the fields of mass production. Then, practical use of this test method in actual fields of mass production of integrated circuit has been difficult.

SUMMARY OF THE INVENTION

An aspect of the present invention inheres in a test system, including a measuring unit configured to measure an integrated circuit; an input unit configured to receive measurement conditions of the integrated circuit; a grouping module configured to group measurement points on the basis of values of quiescent supply current at the measurement points and to set measurement point groups; an average value setting module configured to set a weighted average value minimizing the sum of dispersion of the quiescent supply current due to differences in process condition between the measurement point groups; a calculating module configured to calculate a maximum estimated value of the dispersion of the quiescent supply current on the basis of the weighted average value; a storage unit configured to store a judgment specification for the measurement point groups by the measurement conditions and the values of the quiescent supply current; and a judgment module configured to judge whether the integrated circuit passes or fails the judgment specification.

Another aspect of the present invention inheres in a computer implemented method for testing, including reading measurement point information of the quiescent supply current of an integrated circuit and storing the measurement point information in a measurement point area; reading values of quiescent supply current of the integrated circuit and storing the values of quiescent supply current in a sample measurement data area; grouping measurement points on the basis of values of the quiescent supply current, and setting measurement point groups; setting a weighted average of the dispersion of the quiescent supply current so that the sum of the variance indicating the dispersion of the quiescent supply current is given a minimum, due to differences in the process conditions between the measurement point groups; setting a judgment specification for the measurement point groups on the basis of the difference between the weighted average and the dispersion of the quiescent supply current; and judging whether the integrated circuit passes or fails the judgment specification.

Still another aspect of the present invention inheres in a computer program product for executing a test system, including instructions configured to read at measurement point information of a quiescent supply current of an integrated circuit and to store the measurement point information in a measurement point area; instructions configured to read the values of the quiescent supply current of the integrated circuit and to store the values of the quiescent supply current in a sample measurement data area; instructions configured to group measurement points on the basis of the values of the quiescent supply current, and setting measurement point groups; instructions configured to set a weighted average of the dispersion of the quiescent supply current so that the sum of variance indicating the dispersion of the quiescent supply current is given a minimum, due to differences in process conditions between the measurement point groups; instructions configured to set a judgment specification for the measurement point groups on the basis of the difference between the weighted average and the dispersion of the quiescent supply current; and instructions configured to judge whether the integrated circuit passes or fails the judgment specification.

DETAILED DESCRIPTION OF THE INVENTION

Figure 1:
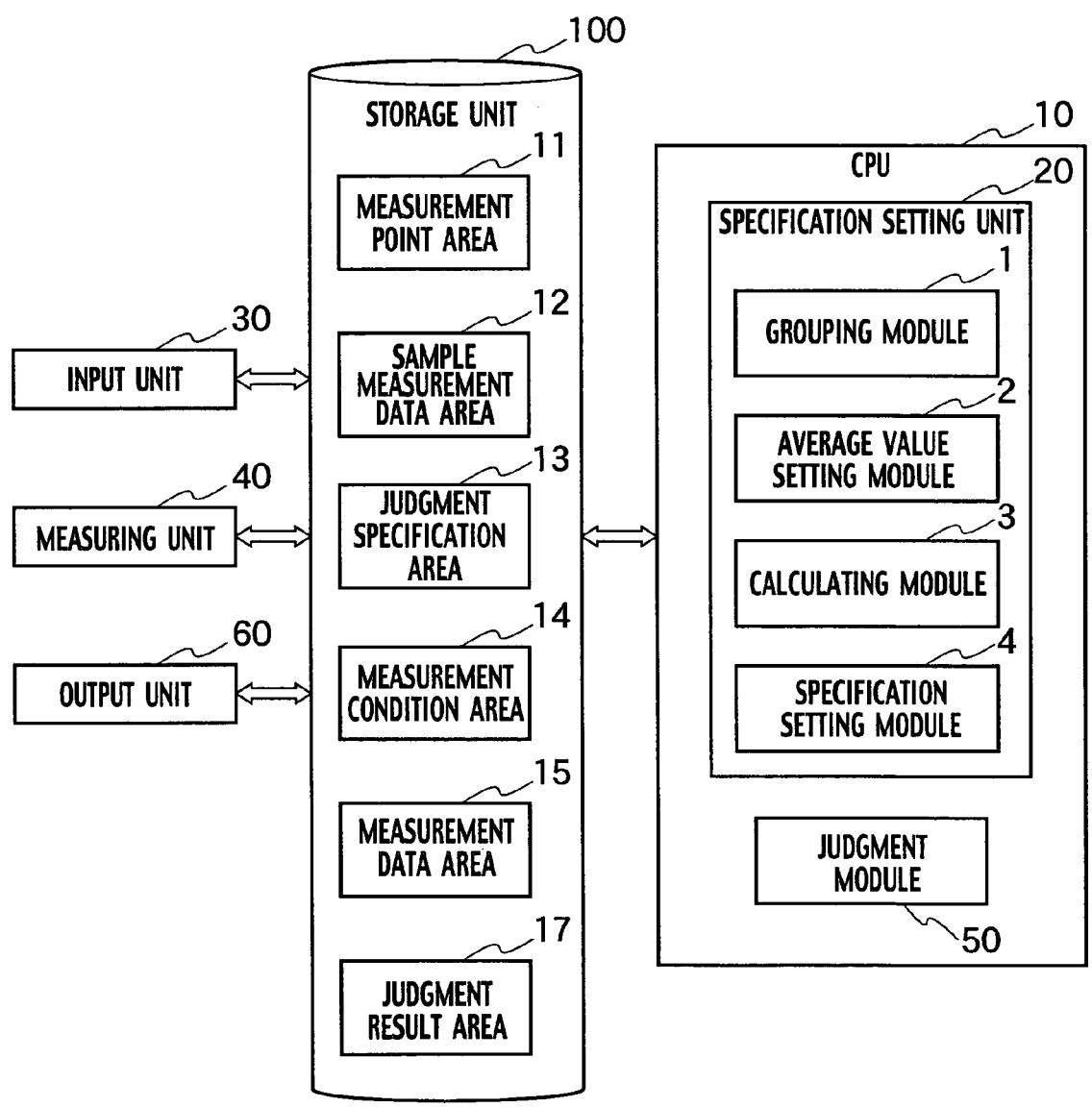
FIG. 1 is a view showing a schematic circuit configuration of the test system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

FIRST EMBODIMENT

A test system related to the first embodiment of the present invention includes, as shown in FIG. 1, a CPU unit 10, an input unit 30, a storage unit 100, a measuring unit 40 and an output unit 60. The storage unit 100 also includes a measurement point area 11, a sample measurement data area 12, a judgment specification area 13, a measurement condition area 14, a measurement data area 15 and a judgment result area 17. Furthermore, the CPU 10 includes a specification setting unit 20 and a judgment module 50. The specification setting unit 20 includes a grouping module 1 which groups measurement points on the basis of values of quiescent supply current IDDQ of measurement points and sets measurement point groups, an average value setting module 2, which sets a weighted average value at which the sum of dispersion of quiescent supply current IDDQ due to differences in the process conditions of the measurement point groups becomes a minimum, a calculating module 3 which calculates a maximum value of the dispersion of the quiescent supply current IDDQ to be considered according to the value of the quiescent supply current IDDQ at each measurement point group, and a specification setting module 4.

For the setting of the judgment specification, information on measurement points of the value of the quiescent supply current IDDQ and the measurement data on the value of the quiescent supply current IDDQ of the process margin sample are received from the input unit 30 to the test system and stored in the measurement point area 11 and the sample measurement data area 12 respectively, and then read by the specification setting unit 20, the judgment specification is set. The judgment specification set by the specification setting unit 20 is stored in the judgment specification area 13. Measurement conditions necessary for the testing of the integrated circuit and judgment values that provide a judgment specification are stored in the measurement condition area 14 and the judgment specification area 13 respectively. Measurement conditions include also test patterns, and judgment specification includes information on grouped measurement points as well as information on the construction of mathematical formulas that process measurement data.

The measuring unit 40 is constituted by power supplies, such as a constant current source and a constant voltage source, an LSI tester having the functions of an ammeter, a voltmeter and the like, and a prober, all of which are not shown in the figures. The measuring unit 40 reads measurement conditions necessary for the test of an integrated circuit from the measurement condition area 14, and the integrated circuit is measured. And measurement data are stored in the measurement data area 15. After that, the judgment module 50 reads the measurement data on the integrated circuit from the measurement data area 15. The judgment module 50 judges whether the integrated circuit passes or fails the judgment specification retrieved from the judgment specification area 13. The result of the pass/fail judgment of the integrated circuit is stored in the judgment result area 17 and delivered to the output unit 60 as appropriate.

Before describing a method of setting judgment specification for the test system related to the first embodiment of the present invention, a method of calculating a weighted average value and a method of calculating dispersion values under each process condition, which are necessary for setting judgment specification, and a method of discriminating between a fault-free (good) product and a faulty product will be described below.

In a process margin evaluation, in addition to the process center condition which provides the target condition during mass production, process conditions differing from the process center condition are used in order to evaluate whether there are sufficient margins or not in various characteristics of an integrated circuit, including operating voltage and operating frequency, that is, to evaluate whether or not the risk of failing to meet specifications is sufficiently small with process dispersion in mass production. These conditions are called "process corner conditions." For example, it is possible that when the process center condition for the threshold voltage of an NMOS transistor Vth, n is 0.6 V, the process corner condition is 0.45 V etc. Additionally, it is possible that when the process center condition for the threshold voltage of a PMOS transistor Vth, p is −0.6 V the process corner condition is −0.75 V etc. Furthermore, a transistor's gate-length Lpoly can be used as a main physical parameter.

Figure 4:
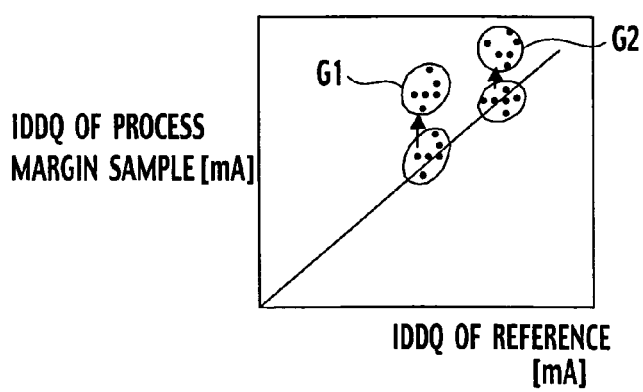
FIG. 4 is a graph showing the image of the measurement point groups comparing the values of the quiescent supply current IDDQ of the process margin sample and the values of the reference (samples') quiescent supply current IDDQ.

A sample produced by using process conditions variously changed from the process center condition like these is called a "process margin sample." FIG. 4 shows an example of a result of measurements of a quiescent supply current IDDQ of a process margin sample measured at a plurality of measurement points. The ordinate of FIG. 4 shows the quiescent supply current IDDQ of an integrated circuit and the abscissa indicates an average of the values of the quiescent supply current IDDQ of a plurality of references. As shown in FIG. 4, the measured values of the quiescent supply current IDDQ of the process margin samples under given process corner conditions are different from the measured values of the quiescent supply current IDDQ of references and are distributed in a plurality of separate groups. In FIG. 4, these groups are shown as Group G1 and Group G2. The value of the quiescent supply current IDDQ of the process margin samples of the group G1 and the group G2 are larger than the value of the quiescent supply current IDDQ of the references. However, also cases where the former is smaller than the latter can occur.

Although in FIG. 4 only the two groups G1 and G2 are shown, in a case where a larger number of process corner conditions are used, it is possible that the number of measurement point groups of almost the same value of the quiescent supply current IDDQ increases. In the present embodiments, the value of the quiescent supply current IDDQ is measured like this in process margin samples produced for a process margin evaluation of integrated circuits, and, on the basis of this measurement, measurement points at which the quiescent supply current IDDQ behaves in a similar manner under all set process conditions are brought together in the same group, and then dispersion is controlled for each group. Or, abnormal current values are used to detect faulty (defective) products. The validity of this grouping has already been verified in a few integrated circuits. "To behave in a similar manner" refers to the following cases in all process conditions used in an evaluation:

a) the quiescent supply current IDDQ is present within a specific limited region, or can be fitted by a straight line whose inclination is almost fixed;

b) the quiescent supply current IDDQ can be fitted by an appropriate straight line; and c) the quiescent supply current IDDQ can be fitted by an appropriate curve such as a higher order curve, an exponential curve, or a mathematic curve. In the measurement points included in the Group G1 and the group G2 shown in FIG. 4, the measured values of the quiescent supply current IDDQ within each group are almost the same. This is an example of a).

If the variance S0 that indicates the whole dispersion of values of the quiescent supply current IDDQ at all the measurement points of an integrated circuit is expressed as the sum of dispersion in the values of the quiescent supply current IDDQ in each group, the variance S0 is shown as follows:

$$S0 = S(G1) + S(G2) + \ldots + dG \qquad (1)$$

where S(G1), S(G2), ..., respectively denote a variance which indicates a dispersion within the Group G1, the Group G2, ..., and dG denotes a dispersion between groups. By paying special attention to the dispersion within each group, the variance S0' which indicates the dispersion within all the groups is defined as follows:

$$S0'=S(G1)+S(G2)+\ldots \quad (2)$$

The variances S(G1), S(G2), ..., of each group and the variance S0' of the whole will take small values in the quiescent supply current IDDQ of an integrated circuit which is a fault-free (good) product, because in Equation (2) measurement points are grouped by almost the same value of the quiescent supply current IDDQ. However, due to the fact that the variances S(G1), S(G2), ..., of each group and the variance S0' of the whole are in proportion to the sum of the squares of a difference between the values of the quiescent supply current IDDQ at each measurement point and the average value of the quiescent supply current IDDQ at all measurement points of a group to which the measurement point belongs, there is a problem that it is difficult to increase the ability to detect abnormal values of the quiescent supply current IDDQ among the measurement points of each group.

Hence, for the above-described judgment on fault-free (good) or faulty (defective) products after the grouping of the measurement points, the method of detecting abnormal values in each group is favorable for the improvement of the detection ability and reliability of the judgment. Incidentally, the measurement points of the quiescent supply current IDDQ are grouped by using evaluation results of process margin samples. Usually, process margin samples are used mainly to evaluate the margins of design characteristics, such as operating frequency, and it is normal to prepare process margin samples for extreme process conditions under which process corner values are adopted for both of Vth,n and Vth,p.

However, this cannot be the best method for estimating with better accuracy, the value of quiescent supply current IDDQ at each measurement point in an integrated circuit which is a fault-free (good) product under process conditions which are applied with high probability during mass production. Hence process margin samples in which, for example, a process corner value is adopted for only either of Vth,n and Vth,p and in which the other means a process center value may be prepared. This method makes it possible to evaluate the behavior of the value of the quiescent supply current IDDQ at each measurement point under conditions closer to the process conditions which are applied with high probability during mass production, and accordingly higher accuracy estimation can be made. In the above-described evaluation of process margin samples, samples of process center values as well as process margin samples of minimum and maximum process corner values are prepared basically with respect to the threshold voltage Vth,n and Vth,p of NMOS and PMOS transistors and transistor gate length Lpoly. However, if process margin samples in which either physical parameter is assigned to be a process center value as a process condition as described above are also prepared, the estimation accuracy of the quiescent supply current IDDQ is improved and the ability to detect abnormal values is improved.

However, on the other hand, setting of many process margin conditions requires extra evaluation costs and resources. Furthermore, recently there have been integrated circuits that use several kinds of threshold voltages to ensure compatibility between high speed and low consumption power, there are also cases where the number of process margin conditions is reduced at the cost of accuracy to some degree. In any event, there are various cases as to what process conditions are set in preparing such process margin samples. However, all of these cases are included in the scope of the present embodiments, which involves efficiently detecting abnormalities of the quiescent supply current IDDQ of an integrated circuit on the basis of an evaluation of margin samples prepared under a plurality of process conditions.

The procedure after the completion of the grouping of measurement points will be described below.

Figure 5:
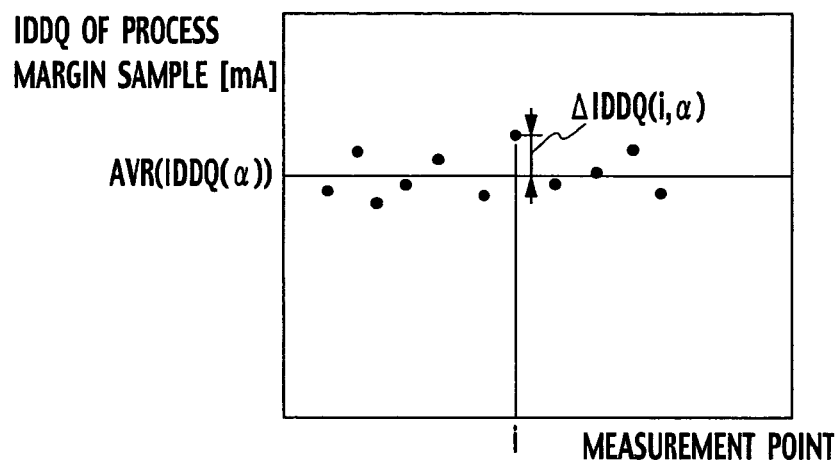
FIG. 5 is a graph showing the dispersion of the values of the quiescent supply current IDDQ at each measurement point.
Figure 6:
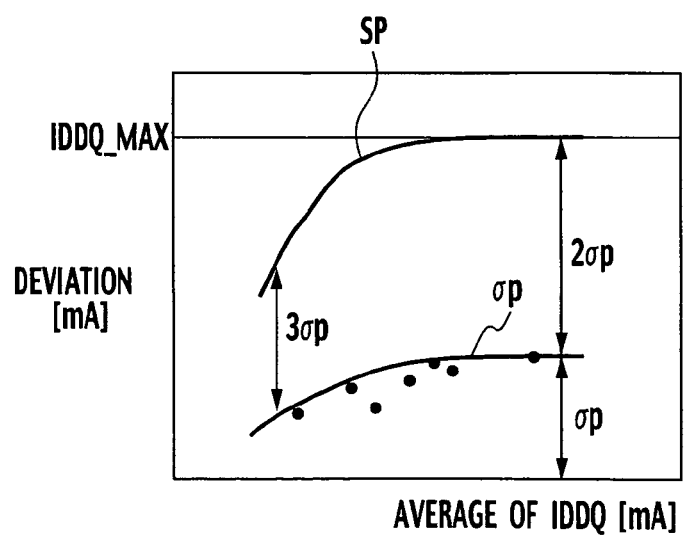
FIG. 6 is a graph showing an average value and a standard deviation of the dispersion of the values of the quiescent supply current IDDQ.

First, in each group, residual values of the sample measurement data for each measurement point are calculated. The residual value of quiescent supply current IDDQ (i, α) under a process condition α at a measurement point i shown in FIG. 5 is given by:

$$\Delta IDDQ(i, \alpha)=IDDQ(i, \alpha)-AVR(IDDQ(\alpha)) \quad (3)$$

where AVR (IDDQ (α)) is an average value of the quiescent supply current IDDQ (i, α) under the process condition α. Using the Equation (3), the variance which shows the dispersion within Group G (n) (n=1, 2, ...) in a case where the number of measurement points is m, under a process condition α, is defined as shown in Equation (4):

$$S(G(n), \Delta IDDQ(\alpha))=\{1/(m-1)\}\Sigma\{IDDQ(i, \alpha)-\Delta IDDQ\_op(i)-AVR(IDDQ(\alpha))\}^2 \quad (4)$$

where, Σ means the sum of i=1 to m. ΔIDDQ_op(i) is a weighted average value of IDDQ (i, α) under the process condition α. Then, considering FIG. 6, in which the abscissa indicates the average value AVR (IDDQ (α)) of quiescent supply current IDDQ under the process condition α, and the ordinate indicates a deviation of the values of quiescent supply current IDDQ. Then, the square root of Equation (4) (S (G (n), ΔIDDQ (α)))$^{1/2}$, i.e., the deviation σ of the dispersion (variance) of Group G (n) under a process condition α is plotted. Next, by connecting the points at which the deviation σ is large, the envelope of the deviations σ is found, and eventually a dispersion curve σp shown in FIG. 6 is calculated.

The dispersion (deviation) curve σp indicates the greatest dispersion values (deviations) of the value of quiescent supply current IDDQ expected under all process conditions, which correspond to the values of quiescent supply current IDDQ, and depends on the weighted average value ΔIDDQ_op(i). Therefore, ΔIDDQ_op(i) is set so that a variance S0' which indicates the total sum of dispersion of value of the quiescent supply current IDDQ in each group becomes a minimum. For this purpose, the weighted average value ΔIDDQ_op (i) is set so that, for example, the dispersion values become a minimum under a plurality of process conditions. Alternatively, given that during mass production most of integrated circuit are produced under conditions close to the process center condition, the weighted average value ΔIDDQ_op (i) may be set so that the variance S0' becomes a minimum value under all process conditions with a highest weight for the process center condition. For example, the residual values of the quiescent supply current IDDQ under the process center condition may be used. In any of the cases, however, it is important to make sure that those values are leveled so that the dispersion does not become large under specific process conditions.

By setting the weighted average value ΔIDDQ_op (i) in the above manners, it is possible to reduce the variance S0', which indicates a sum of dispersion within each group in its entirety in the case of fault-free (good) products to a minimum value. In the case of using this method in a test for mass production, the dispersion (deviation) curve σp may be found, for example, by considering a difference of measured data between test systems and a measuring system error such as an error due to repeated measurements. In this case, by considering the test to be a part of the process, the difference of measured data between test systems can be grouped by regarding the difference of measured data between measuring systems as one of the process conditions. As described above, the dispersion (deviation) curve σp is calculated with a weighted average value which reduces the whole (sum of) dispersion within a group to be a minimum and with a maximum estimated value of dispersion (deviation) under each process condition which is expressed by the value of the quiescent supply current IDDQ.

Figure 7:
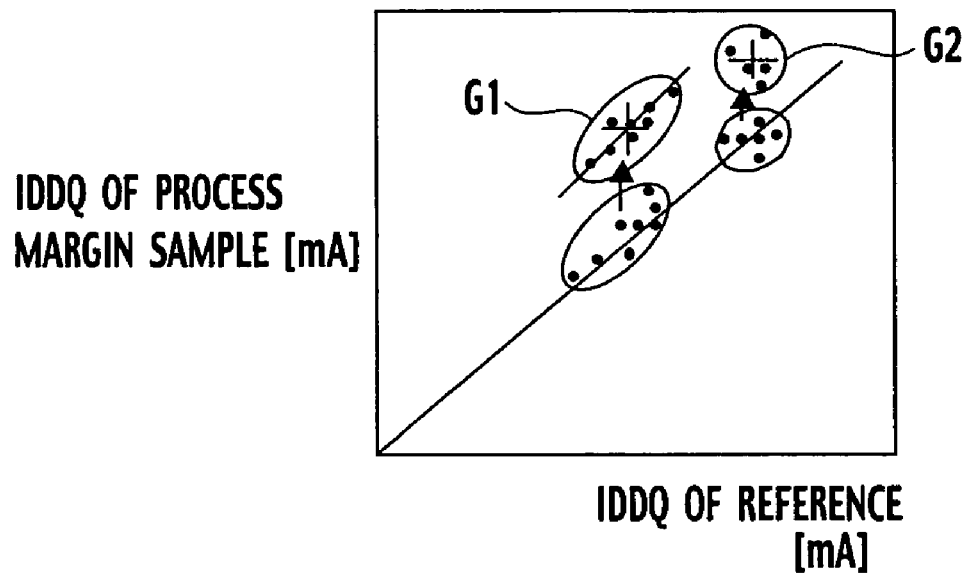
FIG. 7 is a graph showing the measurement point groups fitted by a straight line of a process margin sample.

Incidentally, in a case as shown in Group G1 in FIG. 7, a group i at a measurement point is fitted by an appropriate straight line (corresponding to the definition b) of "to behave in a similar manner"), Equation (3) above is written as follows:

$$\Delta IDDQ(i, \alpha) = IDDQ(i, \alpha) - \{a(\alpha) \cdot IDDQ\_\text{reference}(i) + b(\alpha)\} \quad (5)$$

where $a(\alpha)$ and $b(\alpha)$ are each an appropriate constant for fitting. This value is substituted in the variance $S(G(n), \Delta IDDQ(\alpha))$ indicated by Equation (6) below obtained by changing Equation (4) above, to ensure that the dispersion S0' which indicates the sum of dispersion of value of the quiescent supply current IDDQ within all the groups becomes a minimum, as described above.

$$S(G(n), \Delta IDDQ(\alpha)) = \{1/(m-1)\} \Sigma \{\Delta IDDQ(i, \alpha) - \Delta IDDQ\_op(i)\}^2 \quad (6)$$

However, in this case, $\Delta IDDQ\_op(i)$ should be constituted as follows.

$$\Delta IDDQ\_op(i) = a\_op \cdot IDDQ\_\text{reference}(i) + b\_op \quad (7)$$

In Equation (7), a_op and b_op are values obtained by calculating weighted values under a process condition α using a (α) and b (α) as parameters for adjustment. It is necessary to pay attention to the fact that in the case of fitting using a straight line, the number of adjustment parameters is larger than in the case of fitting using an average value, with the result that the accuracy of estimation of dispersion is apt to decrease. For this reason, it is ensured that information is also grasped on the relationship between the values of the quiescent supply current IDDQ at each measurement point group under each process condition. As a result of this, it becomes possible to more accurately grasp changes in the value of the quiescent supply current IDDQ caused by variations in process conditions and it becomes possible to know more in detail about how fluctuated process condition an integrated circuit has been produced under, whereby permitting improvements in the accuracy of estimated values of dispersion and eventually in the reliability of a judgment on whether products are fault (defect)-free or faulty (defective). Specifically, the coordinate data in the center of gravity of each measurement point group indicated by a symbol "+" in FIG. 7 is stored together with the process conditions of the process margin samples. As a matter of course, this procedure can be effectively used as a method of improving the estimation accuracy of dispersion also in a case where fitted by an average value. Incidentally, in the case of a general curve, it is, basically, possible that an equation of fitting is written in the part $\{\Delta IDDQ(i, \alpha) - \Delta IDDQ\_op(i)\}$ of Equation (5) and each coefficient is used as a parameter for adjustment.

Next, a description will be given of a method of setting the specification curve Sp, used in detecting abnormal values of the quiescent supply current IDDQ, by using the dispersion (deviation) curve σp. In the specification curve Sp, for example, 3×σp is set in a region of small quiescent supply current IDDQ and the upper limit IDDQ_MAX, which provides a limit to the quiescent supply current IDDQ of an integrated circuit, is set in a region of large quiescent supply current IDDQ. If this IDDQ_MAX is exceeded, the integrated circuit is regarded as a faulty (defective) product. This is because, when the value of the quiescent supply current IDDQ of an integrated circuit is large, the dispersion value of a process margin sample measured to introduce the dispersion curve σp is generally large and values of the dispersion curve σp are also large. At this time, if the IDDQ_MAX of specification for abnormal currents is, for example, 3×σp, then the judgment specification as to whether an integrated circuit is a fault-free (good) or a faulty (defective) product becomes too lax and there is a risk that a faulty (defective) product might be judged to be a fault-free (good) product. For this reason, an upper limit to the value of the quiescent supply current IDDQ_MAX is set. FIG. 6 shows the specification curve Sp where the upper limit of the value of the quiescent supply current IDDQ_MAX is set at 2×σp. Incidentally, a fixed value may be determined in relation to some standard IDDQ_MAX instead of using the dispersion curve σp, for example, the value of about 4 times of the quiescent supply current IDDQ under the process center condition. Furthermore, it is needless to say that a curve in proportion to the dispersion curve σp may be used in the whole region of the quiescent supply current IDDQ instead of setting the upper limit IDDQ_MAX.

Next, a method of discriminating between a fault (defect)-free (or good) product and a faulty (defective) product will be described. If a failure which makes the quiescent supply current IDDQ abnormal is present in an integrated circuit, then it is thought that the dispersion value of the quiescent supply current IDDQ at each group becomes large. In this case, a fault-free (good) product can be discriminated from a faulty (defective) product by setting, for each group, a specification value for judging whether the quiescent supply current IDDQ is normal or not.

Figure 8:
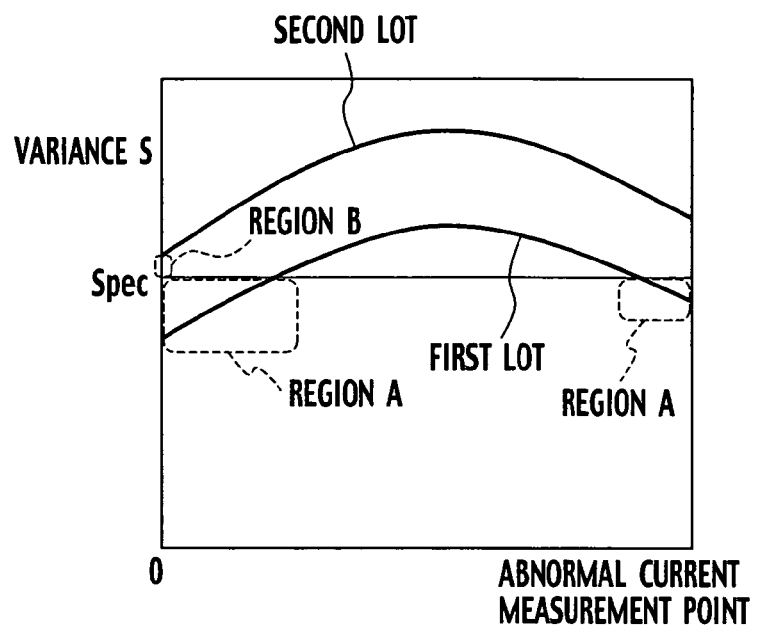
FIG. 8 is a graph showing the relationship between the number of abnormal current measurement points and the variance of the dispersion of the values of the quiescent supply current IDDQ.

However, as has already been stated, in the test method related to the first embodiment of the present invention, due to the fact that values of the quiescent supply current IDDQ at a plurality of measurement points are used in judging whether an integrated circuit is a fault-free (good) or a faulty (defective) product, it is necessary to examine the relationship between the dispersion value of the quiescent supply current IDDQ at each group and the dispersion value of the quiescent supply current IDDQ of the whole integrated circuit. FIG. 8 shows the relationship between the number of abnormal current measurement points at which the quiescent supply current IDDQ is abnormal (abnormally high) and the variance S which shows the dispersion of value of the quiescent supply current IDDQ, in a case where integrated circuits having a small dispersion value between measurement points of the quiescent supply current IDDQ belong to the first lot, and where integrated circuits having a large dispersion value between measurement points of the quiescent supply current IDDQ belong to the second lot. Fundamentally, in order that an integrated circuit is a fault-free (good) product, it is necessary that the number of abnormal current measurement points be zero. In FIG. 8, the judgment specification for variance S is indicated as "Spec," and an integrated circuit is regarded as a fault-free (good) product when S≦Spec is established. An integrated circuit in Region A in FIG. 8 is basically faulty (defective) because abnormal current measurement points are present in this region. However, the integrated circuit in Region A is judged to be a fault-free (good) product because the number of the abnormal current measurement points is small, and because the dispersion value of the quiescent supply current IDDQ as a whole is small. This wrong judgment occurs frequently especially in the case of the first lot in which the dispersion value between measurement points of the quiescent supply current IDDQ is small.

On the other hand, if the judgment specification Spec is made small in order to judge an integrated circuit in Region A to be a faulty (defective) product, there is a possibility that a fault-free (good) product might be judged to be a faulty (defective) product. In other words, this means that an integrated circuit in Region B, which is a fault-free (good) product, is judged to be a faulty (defective) product and this occurs frequently in the case of the second lot having a large dispersion. For this reason, there are limitations on setting the judgment specification Spec at a small value.

Figure 3:
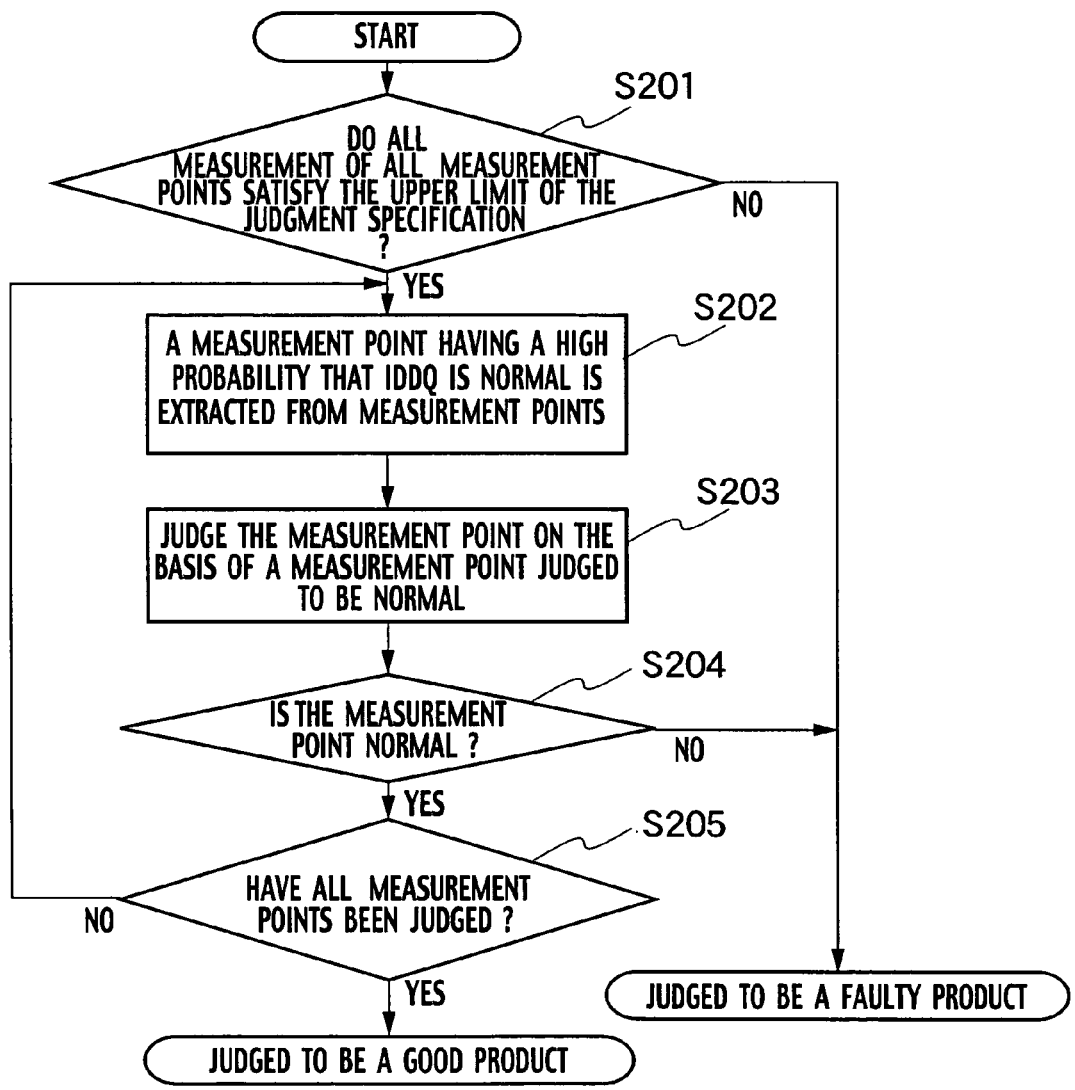
FIG. 3 is a flowchart explaining a method of pass/fail judgment of the test system according to the first embodiment of the present invention.

In order to solve this problem, it is effective to make a pass/fail judgment at each measurement point. This pass/fail judgment method will be described by using the flowchart of FIG. 3.

(a) In Step S201, in a case where an upper limit to the judgment specification for the quiescent supply current IDDQ is set, an integrated circuit is judged to be a faulty (defective) product if there is even only one measurement point at which the judgment specification are not satisfied.

(b) In Step S202, a measurement point i having a high probability that the measurement point is normal is extracted from between measurement points which are the objects of judgment. Measurement points which are the first objects of judgment are all the measurement points. As a method of extraction, for example, a measurement point i at which the difference between a measured value of the quiescent supply current IDDQ and the weighted average value ΔIDDQ_op (i) is a minimum is extracted.

(c) In step S203, on the basis of a measurement point which has already been judged to be normal, it is judged whether the measurement point which has been extracted in Step S202, is normal or abnormal (abnormally high), by a method which will be described below. Because there are little comparison objects at first, the measurement point which has been extracted in Step S202 is normal.

(d) In Step S204, in a case that the measurement point is judged to be normal, the process is advanced to Step S205, and in the other cases the integrated circuit is judged to be a faulty (defective) product.

(e) In Step S205, if the judgment at all the measurement points is completed, the integrated circuit is judged to be a fault-free (good) product. Otherwise, the process is returned to Step S202.

As the judgment method in Step S203, for example, the following method can be applied. First, the difference between a measured value of the quiescent supply current IDDQ and a weighted average value ΔIDDQ_op (i) at a measurement point i having a high probability that the measurement point is normal is assigned to be a minimum offset di. Then the difference between a measured value of the quiescent supply current IDDQ at a measurement point which is the next object of judgment and a weighted average value at this measurement point is assigned to be an offset value. The difference d between the offset value at the measurement point and a minimum offset di is found. Next, by making a comparison between the difference d and the specification value d_Spec set by the method shown below, it is judged whether the measurement point is normal or abnormal. This procedure is sequentially performed with a measurement point of which has already been judged normal and a measurement point which is an object of judgment.

Figure 9:
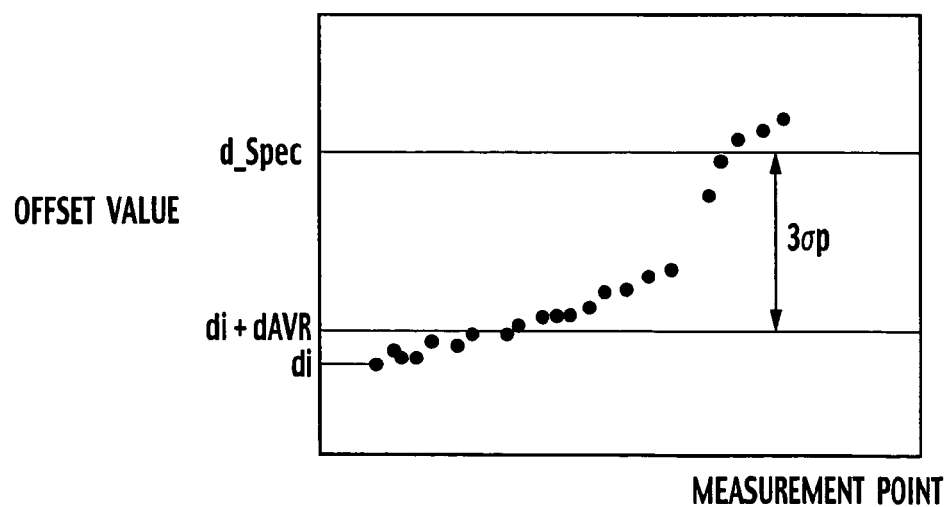
FIG. 9 is a graph showing the relationship between the measurement points and the offset value indicating the dispersion of the values of the quiescent supply current IDDQ.

As the method of setting the specification value d_Spec, it is possible to use values of the dispersion curve σp, to use a prescribed fixed value and the like. FIG. 9 shows a judgment method which uses, for example, a moving average value d_AVR of the difference between a measured value of the quiescent supply current IDDQ at each measurement point which has already been judged to be normal and a weighted average value ΔIDDQ_op (i) as well as the dispersion curve σp. The value of di+d_AVR is assigned to be an average offset value of measurement points, and it is judged that a measurement point at which the offset value deviates from di+d_AVR, for example, by more than 3×σp is abnormal. Or, as a simple way, a measurement point is judged to be a abnormal when a value of the quiescent supply current IDDQ of the point is larger than the quiescent supply current IDDQ of precedent measurement point by more than 3×σp.

Because it is possible to use the above-described judgment method by finding beforehand the dispersion curve σp of an integrated circuit, it is possible to judge whether integrated circuit is fault-free (good) or faulty (defective) product in response to process conditions, the stability of dispersion of value of the quiescent supply current IDDQ and the like for each lot.

Figure 2:
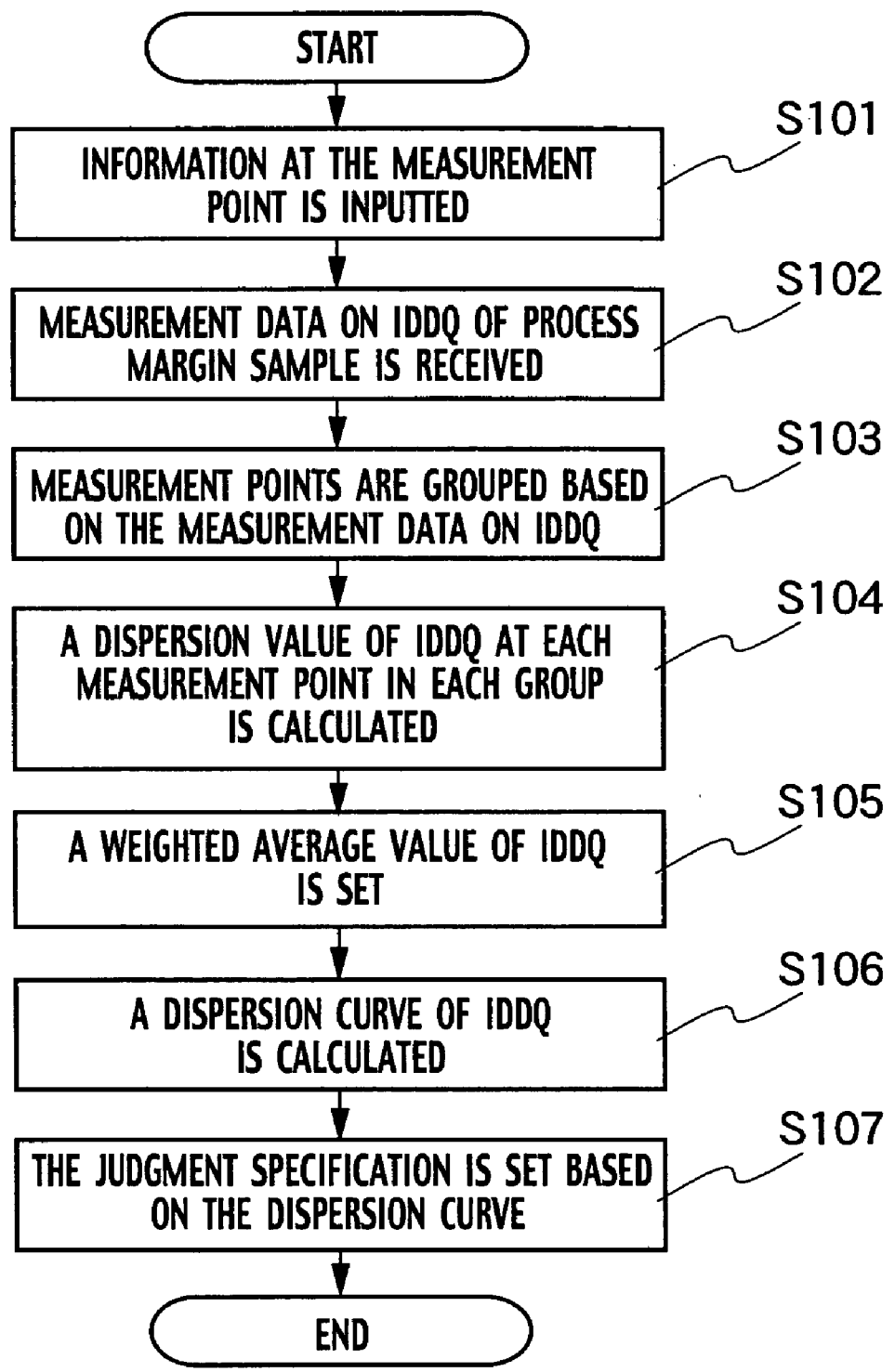
FIG. 2 is a flowchart explaining a method of setting the good/faulty judgment specification of the test system according to the first embodiment of the present invention.

A method of setting the judgment specification for a test system according to the first embodiment of the present invention will be described below by using the flowchart of FIG. 2.

(a) In Step S101, the measurement point information is received from the input unit 30 and is stored in the measurement point area 11.

(b) In Step S102, measurement data on the quiescent supply current IDDQ of, for example, 5 or more process margin samples is received for each process from the input unit 30 and is stored in the sample measurement data area 12. The measurement data may be received from the measuring unit 40 instead of the input unit 30.

(c) In Step S103, the measurement point information stored in the measurement point area 11 and the measurement data on the quiescent supply current IDDQ of the process margin samples stored in the sample measurement data area 12 are read by the grouping module 1 and collated and measurement points are grouped. Specifically, as described above, measurement points whose values of sample measurement data are close together are grouped together according to the distribution obtained from a comparison with the measurement data on the quiescent supply current IDDQ of references.

(d) In Step S104, a dispersion of value of the quiescent supply current IDDQ at each measurement point in each group is calculated by the average value setting module 2.

(e) In Step S105, a weighted average value of the quiescent supply current IDDQ is set by the above-described method by the average value setting module 2.

(f) In Step S106, a dispersion curve of the quiescent supply current IDDQ is calculated by the above-described method by the calculating module 3.

(g) In Step S107, on the basis of the dispersion curve σp, a Spec curve Sp is set by the specification setting module 4 and a judgment specification is set.

Although in the above description, an example in which the measurement point information is read at Step S101 and subsequently measurement data on process margin samples is read in Step S102 was described, it is needless to say that this order may be reversed.

The judgment specification set by the specification setting module 4 is stored in the judgment specification area 13 and is referred to when the judgment module 50 judges whether an integrated circuit passes or fails the judgment specification.

As described above, according to a test system related to the first embodiment of the present invention, it is possible to test which detects abnormalities in the value of the quiescent supply current IDDQ, and in which dispersion in each process during the manufacturing of integrated circuits are considered.

SECOND EMBODIMENT

Figure 10:
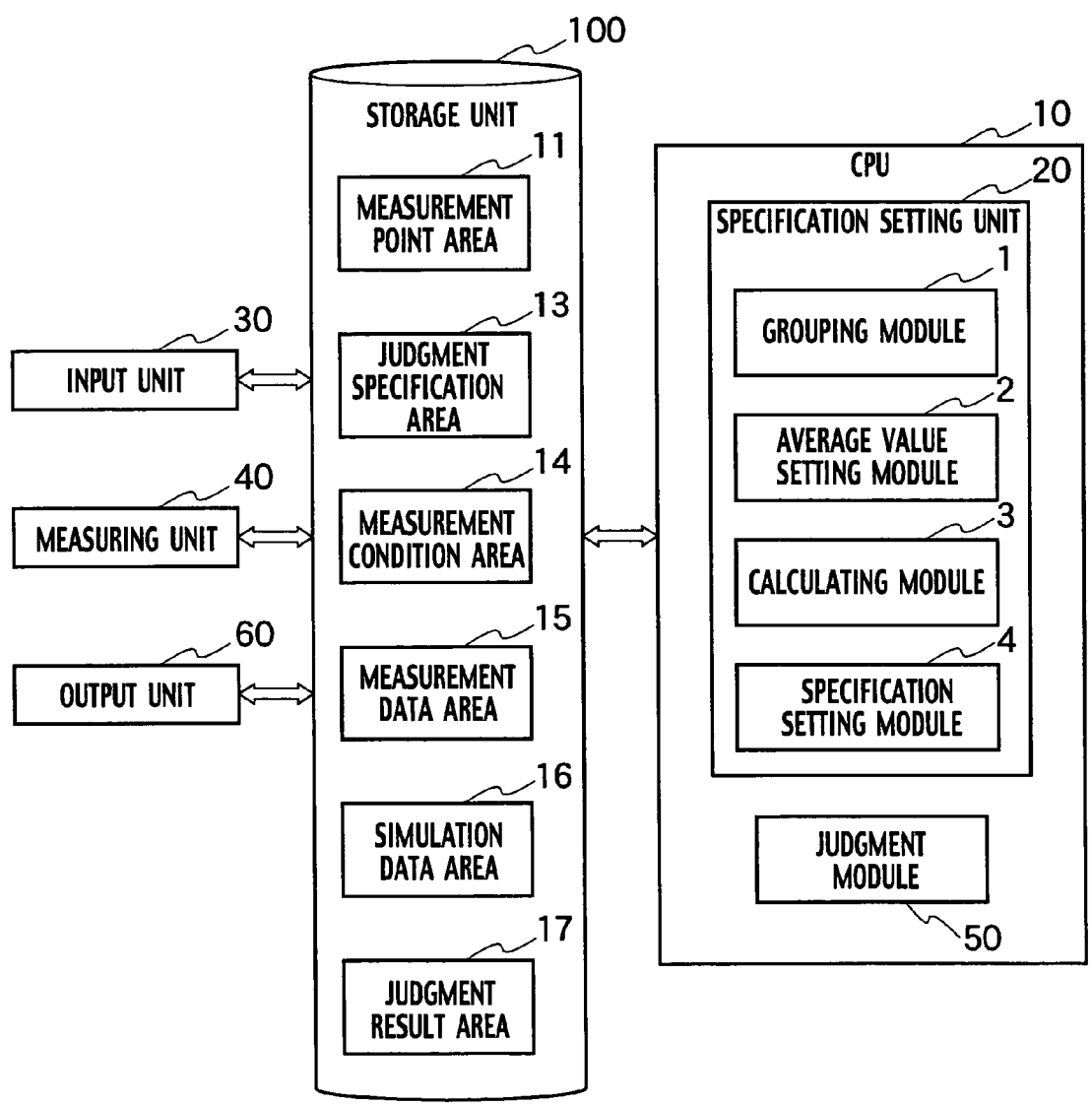
FIG. 10 is a view showing a schematic circuit configuration of the test system according to a second embodiment of the present invention.
Figure 11:
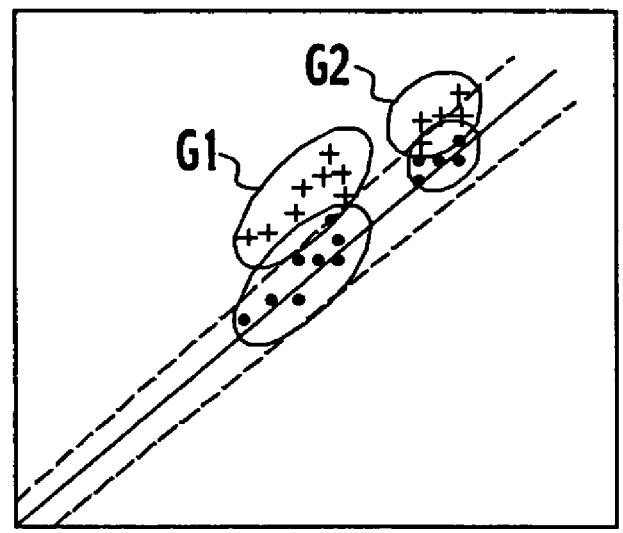
FIG. 11 is a graph showing the relationship between values of the quiescent supply current IDDQ of a process margin sample and the values of the reference (samples') quiescent supply current IDDQ.

A test system related to the second embodiment of the present invention includes, as shown in FIG. 10, a CPU unit 10, an input unit 30, a storage unit 100, a measuring unit 40 and an output unit 60. The storage unit 100 also includes a measurement point area 11, a judgment specification area 13, a measurement condition area 14, a measurement data area 15, a simulation data area 16 and a judgment result area 17. Furthermore, the CPU 10 includes a specification setting unit 20 and a judgment module 50. The specification setting unit 20 includes a grouping module 1 which groups measurement points on the basis of values of the quiescent supply current IDDQ of measurement points and sets measurement point groups, a average value setting module 2 which sets a weighted average value at which the sum of dispersion of the quiescent supply current IDDQ due to difference in the process conditions of the measurement point groups becomes a minimum, a calculating module 3 which calculates a maximum estimated value of dispersion of the quiescent supply current IDDQ to be considered according to the value of the quiescent supply current IDDQ at each measurement point group, and a specification setting module 4.

For the setting of the judgment specification, information on measurement points of the quiescent supply current IDDQ and analysis data provided by the simulation on the quiescent supply current IDDQ are received from the input unit 30 to the test system and stored in the measurement point area 11 and the simulation data area 16 respectively, and then read by the specification setting unit 20, the judgment specification is set. The judgment specification set by the specification setting unit 20 is stored in the judgment specification area 13. Measurement conditions necessary for the test of the integrated circuit and judgment values that provide judgment specification are stored in the measurement condition area 14 and the judgment specification area 13 respectively. Measurement conditions include also test patterns, and judgment specification includes information on grouped measurement points as well as information on the construction of mathematical formulas that process measurement data.

The measuring unit 40 is constituted of power supplies, such as a constant current source and a constant voltage source, an LSI tester having the functions of an ammeter, a voltmeter and the like, and a prober, all of which are not shown in the figures. The measuring unit 40 read measurement conditions necessary for the testing of an integrated circuit from the measurement condition area 14, and the integrated circuit is measured. And measurement data are stored in the measurement data area 15. After that, the judgment module 50 reads the measurement data on the integrated circuit from the measurement data area 15. The judgment module 50 judging whether the integrated circuit passes or fails the judgment specification retrieved from the judgment specification area 13. The result of the pass/fail judgment of the integrated circuit is stored in the judgment result area 17 and delivered to the output unit 60 as appropriate.

The test system shown in FIG. 10 is different from the test system shown in FIG. 1 in that the storage unit 100 includes the simulation data area 16 instead of the sample measurement data area 12. Analysis data provided by the simulation on the quiescent supply current IDDQ of an integrated circuit is found by using the simulation model which, simulates the quiescent supply current IDDQ under various process conditions, and the analysis data are received from the input unit 30 and stored in the simulation data area 16. It is possible to reduce the cost and the time to product and measure the process margin sample. The rest of the operations are substantially the same as the first embodiment. A duplicate description will therefore omitted herein.

According to a test system related to the second embodiment of the present invention, it is possible to test which detects abnormalities in the value of the quiescent supply current IDDQ, and in which dispersion in each process during the manufacturing of integrated circuits are considered.

OTHER EMBODIMENTS

Although in the first and second embodiments a description was given of a case that the test system includes one CPU, as a matter of course, other constructions are possible. The system of the present invention basically includes (a) a specification setting unit 20 and (b) an actual testing system for integrated circuits which uses the judgment specification. It is possible that the specification setting unit 20 is constituted of a first input unit, a first storage unit, a first output unit and a first CPU, where the first storage unit includes a measurement point area 11, a sample measurement data area 12 and a judgment specification area 13, where the first CPU contains a specification setting unit 20 only, and where the judgment specification is delivered from the first output unit. It is also possible that the actual test system of integrated circuit which uses the judgment specification is constituted of a second input unit, a second storage unit, a measurement unit 40 and a second CPU, where the second storage unit includes a judgment specification area 13, a measurement condition area 14, a measurement data area 15 and a judgment result area 17, where the second CPU contains only a judgment module 50 as a CPU in an LSI tester and the like, and where pass/fail judgment results are delivered from the second output unit. It is easy to adopt a different constitution in addition to that. All these changes are included in the scope of the present embodiments.

Although in the above description, a measurement object is the quiescent supply current IDDQ of a narrow sense of a CMOS. However, the present embodiments can apply to an integrated circuit, for example, including the circuit having a stable direct current in quiescent state. The quiescent supply current IDDQ in the above description includes such the stable direct current.

Various modifications will become possible for those skilled in the art after receiving the teachings of the present disclosure without departing from the scope thereof.

What is claimed is:

1. A test system comprising:
 a measuring unit configured to measure an integrated circuit;
 an input unit configured to receive measurement conditions of the integrated circuit;
 a grouping module configured to group measurement points on basis of values of quiescent supply current at the measurement points of a plurality of process margin samples, which are produced by using a plurality of process conditions, respectively, and to set measurement point groups;

an average value setting module configured to set a weighted average value minimizing the sum of dispersion of the quiescent supply current due to differences in process condition between the measurement point groups;

a calculating module configured to calculate a maximum estimated value of the dispersion of the quiescent supply current on the basis of the weighted average value;

a storage unit configured to store a judgment specification for the measurement point groups by the measurement conditions and the values of the quiescent supply current; and a judging module configured to judge whether the integrated circuit passes or fails the judgment specification.

2. The system of claim 1, wherein the values of the quiescent supply current are measurement data of the integrated circuit.

3. The system of claim 1, wherein the values of the quiescent supply current are estimated data provided by simulation of the integrated circuit.

4. The system of claim 1, wherein the grouping module groups the measurement points on the basis of the values of the quiescent supply current measured at a plurality of the measurement points under a plurality of process conditions.

5. The system of claim 1, wherein the grouping module groups the group measurement points on basis of one of:
the values of the quiescent supply current;
the values of the quiescent supply current fitted by a straight line; and
the values of the quiescent supply current fitted by a mathematic curve.

6. The system of claim 1, wherein the maximum estimated value of dispersion is calculated on the basis of a standard deviation of the dispersion of the quiescent supply current at the measurement points.

7. The system of claim 1, further comprising a specification setting module configured to set the judgment specification on the basis of the difference between the weighted average value and the values of the quiescent supply current.

8. The system of claim 1, wherein the judgment specification includes the maximum estimated value of the dispersion of the quiescent supply current calculated on the basis of the weighted average value.

9. The system of claim 1, wherein the grouping module stores an average of the quiescent supply current at the measurement points grouped under a plurality of process conditions.

10. A computer implemented method for testing comprising:
reading measurement point information of a quiescent supply current of an integrated circuit and storing the measurement point information in a measurement point area;
reading values of the quiescent supply current of the integrated circuit and storing the values of the quiescent supply current in a sample measurement data area;
grouping measurement points on the basis of the values of the quiescent supply current of a plurality of process margin samples, which are produced by using a plurality of process conditions, respectively, and setting measurement point groups;

setting a weighted average of dispersion of the quiescent supply current so that the sum of variance indicating dispersion of the quiescent supply current is given a minimum, due to differences in process conditions between the measurement point groups;

setting a judgment specification for the measurement point groups on the basis of the difference between the weighted average and the dispersion of the quiescent supply current; and judging whether the integrated circuit passes or fails the judgment specification.

11. The method of claim 10, wherein grouping the measurement points comprises grouping the measurement points on the basis of the values of the quiescent supply current measured at a plurality of the measurement points under a plurality of process conditions.

12. The method of claim 10, wherein grouping the measurement points comprises grouping the group measurement points on basis of one of:
the values of the quiescent supply current;
the values of the quiescent supply current fitted by a straight line; and
the values of the quiescent supply current fitted by a mathematic curve.

13. The method of claim 10, wherein the judgment specification includes a maximum estimated value of the dispersion of the quiescent supply current calculated on the basis of the weighted average.

14. The method of claim 13, wherein the maximum estimated value of the dispersion of the quiescent supply current is calculated on the basis of a standard deviation of the dispersion of the quiescent supply current at the measurement points.

15. The method of claim 10, wherein judging whether the integrated circuit passes or fails is executed at each the measurement point.

16. A computer program product for executing a test system, comprising:
instructions configured to read measurement point information of a quiescent supply current of an integrated circuit and to store the measurement point information in a measurement point area;
instructions configured to read values of the quiescent supply current of the integrated circuit and to store the values of the quiescent supply current in a sample measurement data area;
instructions configured to group measurement points on the basis of the values of the quiescent supply current of a plurality of process margin samples, which are produced by using a plurality of process conditions, respectively, and setting measurement point groups;
instructions configured to set a weighted average of dispersion of the quiescent supply current so that the sum of variance indicating dispersion of the quiescent supply current is given a minimum, due to differences in process condition between the measurement point groups;
instructions configured to set a judgment specification for the measurement point groups on the basis of the difference between the weighted average and the dispersion of the quiescent supply current; and
instructions configured to judge whether the integrated circuit passes or fails the judgment specification.

* * * * *